(12) United States Patent
Grund et al.

(10) Patent No.: US 10,953,415 B2
(45) Date of Patent: Mar. 23, 2021

(54) NOZZLE TIP ADAPTER, NOZZLE ASSEMBLY AS WELL AS NOZZLE

(71) Applicant: SUSS MicroTec Lithography GmbH, Garching bei Muenchen (DE)

(72) Inventors: Thomas Grund, Oberderdingen (DE); Gary Choquette, Kraichtal (DE); Kader Mekias, Bretten (DE)

(73) Assignee: SUSS MICROTEC LITHOGRAPHY GMBH, Garching bei Munchen (DE)

( * ) Notice: Subject to any disclaimer, the term of this patent is extended or adjusted under 35 U.S.C. 154(b) by 213 days.

(21) Appl. No.: 16/013,481

(22) Filed: Jun. 20, 2018

(65) Prior Publication Data

US 2018/0361403 A1 Dec. 20, 2018

(30) Foreign Application Priority Data

Jun. 20, 2017 (NL) ...................................... 2019096

(51) Int. Cl.
| | |
|---|---|
| *B05B 15/62* | (2018.01) |
| *B05B 1/28* | (2006.01) |
| *B05C 5/02* | (2006.01) |
| *B05B 15/65* | (2018.01) |
| *B05B 1/30* | (2006.01) |
| *H01L 21/67* | (2006.01) |
| *B05C 17/01* | (2006.01) |

(52) U.S. Cl.
CPC .............. *B05B 1/3033* (2013.01); *B05B 1/28* (2013.01); *B05B 15/62* (2018.02); *B05B 15/65* (2018.02); *B05C 5/0225* (2013.01); *B05C 17/014* (2013.01); *H01L 21/6715* (2013.01)

(58) Field of Classification Search
CPC ......... B05B 1/28; B05B 1/3033; B05B 15/50; B05B 15/62; B05B 15/65; B05C 5/0255; B05C 17/014; H01L 21/6715; B67C 3/2608; F16K 23/00
USPC .................................................. 239/104, 119
See application file for complete search history.

(56) References Cited

U.S. PATENT DOCUMENTS

| | | | |
|---|---|---|---|
| 2,134,709 A | | 10/1937 | Drew |
| 4,516,702 A | * | 5/1985 | Schmidt ................ F16K 31/408 141/116 |
| 4,606,382 A | * | 8/1986 | Biller .................... B67C 3/2608 141/1 |
| 4,917,348 A | * | 4/1990 | Phallen ................. B65B 39/001 137/625.3 |
| 5,392,989 A | * | 2/1995 | Hurtig ....................... B05B 1/28 239/119 |

(Continued)

FOREIGN PATENT DOCUMENTS

| | | |
|---|---|---|
| AT | 407385 B | 2/2001 |
| CN | 200985630 Y | 12/2007 |

(Continued)

*Primary Examiner* — Darren W Gorman
(74) *Attorney, Agent, or Firm* — Hayes Soloway PC

(57) ABSTRACT

A nozzle tip adapter has a suction duct, a supply duct, and a base body with a device end and a substrate end. The base body has a nozzle tip recess at its substrate end for receiving a nozzle tip and a projecting portion extending into the nozzle tip recess, wherein the suction duct extends through the projecting portion and the supply duct opens into the nozzle tip recess, wherein the suction duct is being at least partially surrounded by the supply duct. Further, a nozzle assembly and a nozzle are disclosed.

13 Claims, 4 Drawing Sheets

(56) References Cited

U.S. PATENT DOCUMENTS

| | | | | |
|---|---|---|---|---|
| 5,756,155 | A | * | 5/1998 | Tzeng ................ B05B 1/28 427/294 |
| 5,980,769 | A | * | 11/1999 | Yanagisawa ........ H01J 37/3244 216/67 |
| 6,056,208 | A | * | 5/2000 | Pirker ................. B67C 3/2608 239/119 |
| 6,082,629 | A | * | 7/2000 | Lee ..................... B05B 1/28 239/106 |
| 9,061,302 | B1 | | 6/2015 | Peckels |
| 9,458,002 | B2 | | 10/2016 | Treichel et al. |
| 9,486,824 | B2 | | 11/2016 | Uschold et al. |
| 9,799,554 | B2 | | 10/2017 | Fischer et al. |
| 2012/0271252 | A1 | | 10/2012 | Otsuka |
| 2013/0193226 | A1 | | 8/2013 | Uschold et al. |
| 2015/0293453 | A1 | | 10/2015 | Treichel et al. |
| 2016/0300759 | A1 | | 10/2016 | Fischer et al. |

FOREIGN PATENT DOCUMENTS

| | | | |
|---|---|---|---|
| CN | 101396768 A | 4/2009 | |
| CN | 102574615 A | 7/2012 | |
| CN | 103037978 A | 4/2013 | |
| CN | 202953804 U | 5/2013 | |
| CN | 104973554 A | 10/2015 | |
| CN | 105383786 A | 3/2016 | |
| CN | 106057639 A | 10/2016 | |
| CN | 106185762 A | 12/2016 | |
| CN | 106392078 A | 2/2017 | |
| EP | 0139211 A2 | 5/1985 | |
| EP | 1319446 A2 | 6/2003 | |
| JP | H0631207 A | 2/1994 | |
| JP | H0644703 | 6/1994 | |
| JP | 2017000968 A | 1/2017 | |
| WO | 2011154220 A1 | 12/2011 | |
| WO | WO-2011154220 A1 * | 12/2011 | ........... B67C 3/2608 |
| WO | 2013117633 A1 | 8/2013 | |

* cited by examiner

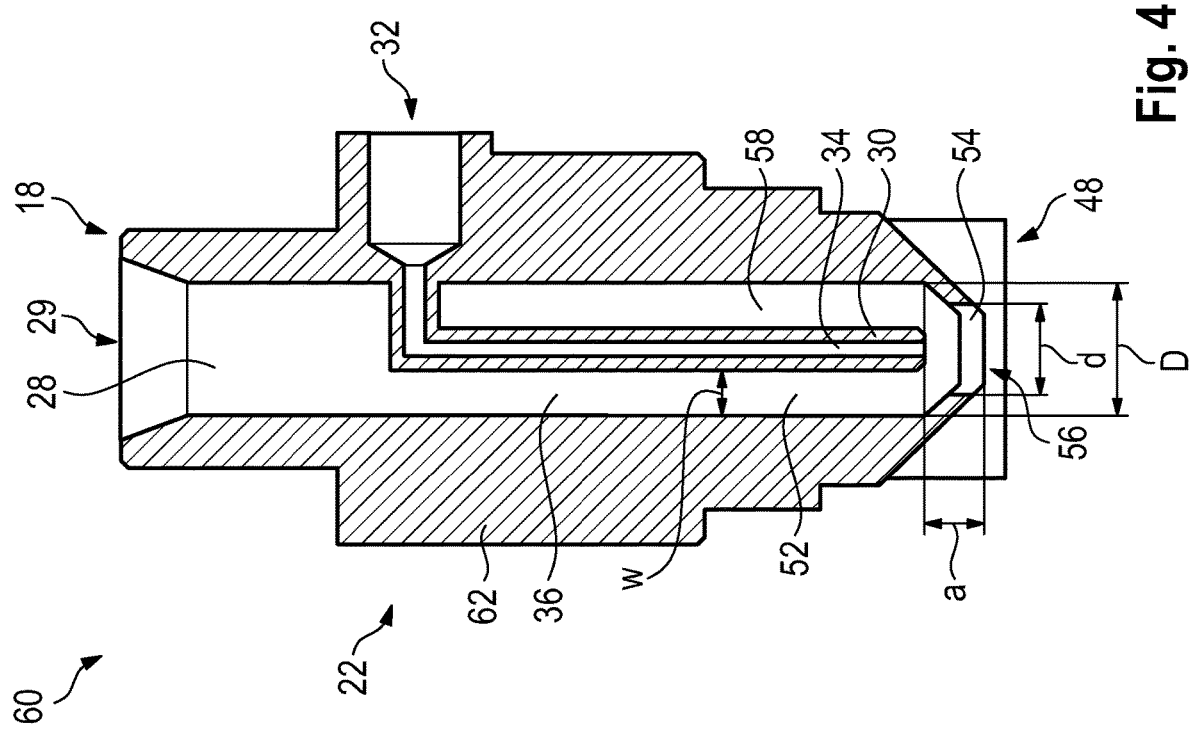
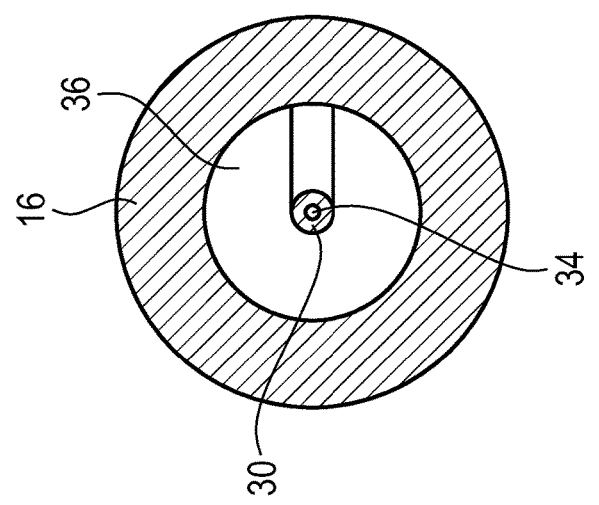
Fig. 4
Fig. 3

NOZZLE TIP ADAPTER, NOZZLE ASSEMBLY AS WELL AS NOZZLE

FIELD OF THE DISCLOSURE

The disclosure concerns a nozzle tip adapter for mounting a nozzle tip to a substrate processing device, a nozzle assembly for a substrate processing device as well as a nozzle for supplying a liquid to a substrate.

BACKGROUND

In known substrate processing devices for nano- and microfabrication, it is necessary to dispense a liquid onto the substrate. The substrate may be a wafer or the like. The fluid may be developer, water, solvent, or any aqueous solution and is supplied to the substrate via a nozzle. Usually, the liquid is dispensed for a defined dispense period so that a predefined amount of liquid is dispensed. However, at the end of dispense period, a rest of the liquid remains in the nozzle and may drip onto the substrate in an uncontrolled manner.

In substrate processing devices of the state of the art, it is known to prevent the nozzle from dripping after a dispense period by reversing the flow of the liquid to pull back excess liquid from the nozzle.

However, due to air bubbles and the like in the liquid, dripping cannot be prevented completely with this approach.

SUMMARY

Thus there is a need to provide a nozzle tip adapter, a nozzle assembly and a nozzle for a substrate processing device that reliably prevents dripping after the liquid has been dispensed.

For this purpose, a nozzle tip adapter for mounting a nozzle tip to a substrate processing device is provided, comprising a suction duct, a supply duct and a base body with a device end and a substrate end, wherein the suction duct and the supply duct are provided in the base body. The base body has a nozzle tip recess at its substrate end for receiving the nozzle tip and a projecting portion extending into the nozzle tip recess, wherein the suction duct extends through the projecting portion and the supply duct opens into the nozzle tip recess, wherein the suction duct is being at least partially surrounded by the supply duct.

The substrate may be an uncoated substrate like a wafer or a coated substrate. For example, the liquid is developer, solvent, water or an aqueous solution. Further, the substrate processing device may be a device for nano- and/or microfabrication.

In the context of this disclosure, "downstream" means the direction of the general flow of liquid, i.e. from the device end towards the substrate end or towards the substrate itself. The axial direction of the nozzle tip adapter extends also in the downstream direction.

The substrate end and the device end may be opposite to each other.

For example, the projecting portion has a needle shape or forms a hollow needle. Further, the nozzle tip recess may be threaded for receiving a nozzle tip.

Further, the diameter of the suction duct and the projecting portion may be between 0.7 and 4.0 mm.

By providing two different ducts, one of the ducts of the nozzle tip adapter can be used to supply the liquid to the nozzle, whereas the other duct can be used to divert surplus liquid away from the orifice of a nozzle tip after a liquid dispense period. The projecting portion allows for the two ducts to merge very close to the orifice of the nozzle so that all liquid between the orifice and the point at which the ducts merge can be diverted away from the nozzle. Thus, very reliable drip prevention is achieved.

The base body and the projecting portion are immovably fixed to one another. In particular, the base body and the projecting portion are formed as a single piece. This simplifies handling of the nozzle tip adapter.

For example, the suction duct extends through the axial length of the projecting portion and opens at the downstream end of the projecting portion. This way, the suction duct and the supply duct are merged as far downstream as possible.

In order for the projecting portion to reach as far into the nozzle tip as possible, the projecting portion may extend in an axial direction of the base body through the nozzle tip recess and may protrude from the nozzle tip recess with its downstream end. In this case, the downstream end of the projecting portion is the most downstream portion of the nozzle tip adapter.

In an embodiment of the disclosure, the base body comprises a device protrusion at the device end for fixing the nozzle tip adapter to the substrate processing device. The device protrusion may be threaded. By this means, the nozzle tip adapter can easily be mounted between the nozzle tip and the substrate processing device.

In particular, the nozzle tip recess and the device protrusion have the same size and/or complementary shape. This way, it can be assured that the nozzle tip adapter may be mounted between the nozzle tip and the device without changes to the nozzle tip or the device.

In another embodiment, the nozzle tip adapter has a suction port, preferably at the peripheral surface or the device end of the base body, and the suction duct originates from the suction port. The nozzle has further a supply port, preferably at the peripheral surface or at the device end, and the supply duct originates from the supply port. The peripheral surface is the surface between the two ends of the base body and the supply duct may extend through the device protrusion. Further, the suction port may be threaded or a coupling. By providing a suction port, excess liquid that may drip from the nozzle can easily be diverted away from the nozzle outlet. For example, the supply port may be located at the device end and the suction port may be located at the peripheral surface, or vice versa. Further, it is possible that both, the suction port and the supply port, are located at the same surface of the base body, for example the peripheral surface or the end face of the device end.

The disclosure further provides a nozzle tip assembly for a substrate processing device, comprising a nozzle tip adapter according to the disclosure and a nozzle tip. The nozzle tip comprises a nozzle body with a connection end and a discharge end, a fastening protrusion provided at the connection end, a liquid chamber being open towards the connection end and extending at least into the fastening protrusion, and an outlet having an orifice at the discharge end and being fluidly connected to the liquid chamber, preferably at the downstream end of the liquid chamber. The fastening protrusion of the nozzle tip is received in the nozzle tip recess at the nozzle tip adapter, the projecting portion of the nozzle tip adapter extending into the liquid chamber of the nozzle tip. The nozzle tip may be a puddle or a spray nozzle, in particular a fan spray nozzle. The nozzle assembly provides a duct for supplying the liquid and another duct for diverting the liquid from the liquid chamber and away from the outlet. This way, it can be prevented that liquid drips from the outlet or the liquid chamber onto the substrate after a dispense period has ended.

For example, the supply duct of the nozzle tip adapter opens into the liquid chamber, and the upstream end of the liquid chamber and/or the suction duct of the nozzle tip adapter opens into the liquid chamber at the downstream end of the projecting portion. Thus, the suction duct and the supply duct merge at the downstream end of the projecting portion close to the downstream end of the liquid chamber to reliably divert any liquid away from the nozzle in a controlled manner after a dispense period.

In an embodiment, the outlet has a diameter, the distance between the downstream end of the projecting portion and the orifice being at least 0.5 times the diameter of the outlet. For example, the distance is maximum 5 times the diameter of the outlet, preferably between 1 and 3 times the diameter. This way, the distance between the downstream end of the projecting portion and the orifice is small enough to ensure that all of the liquid in the outlet is diverted into the other duct.

For improved performance, the outlet and the suction duct in the projecting portion are coaxial.

In a variation, a channel is being formed between the periphery of the projecting portion of the nozzle tip adapter and the inner walls of the liquid chamber, and the supply duct of the nozzle tip adapter opens into the channel. The channel may have a width between 0.25 mm and 1.0 mm and may be an elongation of the supply duct. In this way, the supply duct is formed with minimal material needed.

For further improving the performance, the channel and the suction duct merge at the downstream end of the liquid chamber.

The disclosure further provides a nozzle for supplying a liquid to a substrate, having a main body with a device end and a discharge end, the main body comprising: a suction duct, a supply duct, a liquid chamber forming portions of the supply duct, an outlet having a smaller diameter than the diameter of the liquid chamber, having an orifice at the discharge end, and being fluidly connected to the liquid chamber, preferably at the downstream end of the liquid chamber, and a projecting portion extending into the liquid chamber. The suction duct extends through the projecting portion and opens into the liquid chamber at the downstream end of the liquid chamber and merges with the supply duct upstream of the outlet. The suction duct is being at least partially surrounded by the supply duct.

The suction duct may extend through the axial length of the projecting portion and may open at the downstream end of the projecting portion. In this way, the suction duct and the supply duct are merged as far downstream as possible.

The main body and the projecting portion are immovably fixed to one another. In particular, the main body and the projecting portion are formed as a single piece. This simplifies handling of the nozzle.

For example, the main body comprises a device protrusion at the device end for fixing the nozzle to a substrate processing device. The device protrusion may be threaded. By this means, the nozzle tip adapter can easily be mounted between the nozzle tip and the substrate processing device. The device protrusion may be threaded.

In an embodiment of the disclosure, the nozzle has a suction port, preferably at the peripheral surface or the device end of the main body, and the suction duct originates from the suction port. The nozzle has a supply port as well, preferably at the peripheral surface or at the device end, the supply duct originates from the supply port. The peripheral surface extends between the two ends of the main body.

The supply duct may extend through the device protrusion. Further, the suction port may be threaded or a coupling. By providing a suction port, excess liquid in the nozzle outlet that may drip from the nozzle can easily be diverted. For example, the supply port may be located at the device end and the suction port may be located at the peripheral surface, or vice versa. Further, it is possible that both, the suction port and the supply port, are located at the same surface of the base body, for example the peripheral surface or the end face of the device end.

In a variation, the distance between the downstream end of the projecting portion and the orifice being at least 0.5 times the diameter of the outlet. For example, the distance is maximum 5 times the diameter of the outlet, preferably between 1 and 3 times the diameter. This way, the distance between the downstream end of the projecting portion and the orifice is small enough to ensure that all of the liquid in the outlet is diverted into the other duct.

For improved performance, the outlet and the suction duct in the projecting portion are coaxial.

In another embodiment, a channel is being formed between the periphery of the projecting portion and the inner walls of the liquid chamber. The channel may have a width between 0.25 mm and 1.0 mm. Thus, the space needed for providing the channel can be minimized.

DESCRIPTION OF THE DRAWINGS

Further features and advantages of the disclosure will be apparent from the following description of the embodiments and the attached drawings to which reference is made. In the drawings, FIG. 3 shows another cross section of the nozzle tip adapter of FIG. 1 across the line III-III, FIG. 4 shows a nozzle according to another embodiment of the disclosure in a cross section.

DETAILED DESCRIPTION

Figure 1:
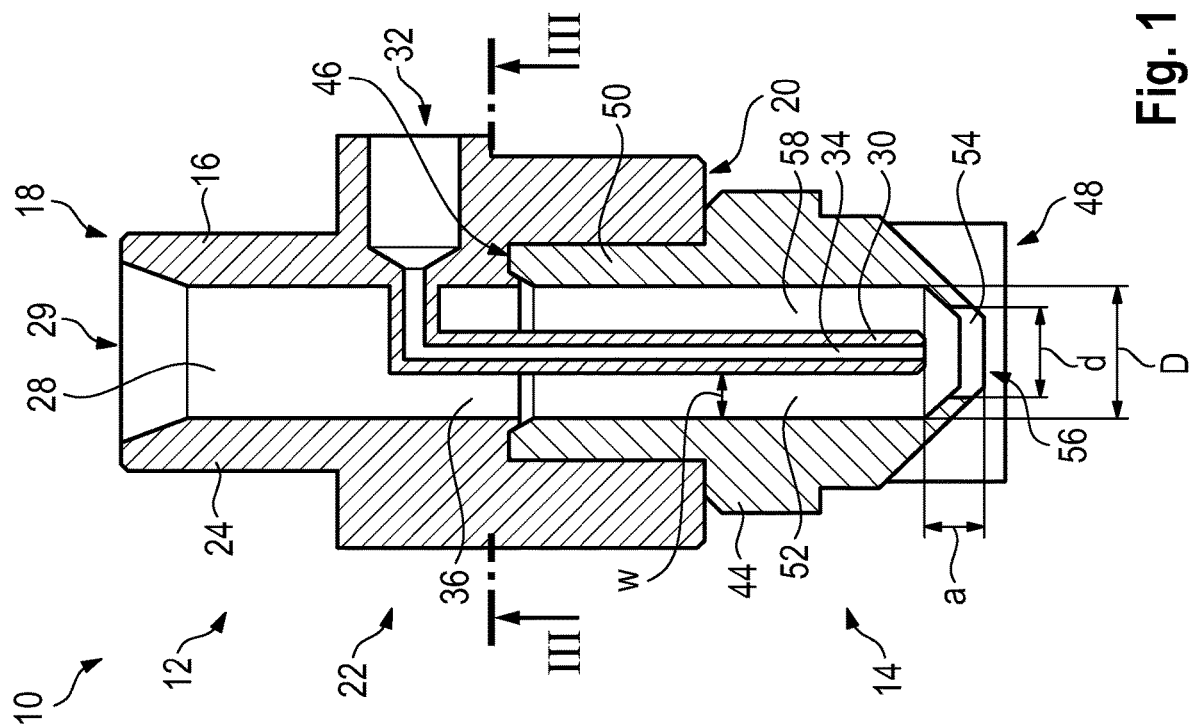
FIG. 1 shows a cross section of a nozzle tip assembly according to a first embodiment of the disclosure with a nozzle tip adapter according to a first embodiment of the disclosure.

FIG. 1 shows a nozzle assembly 10 comprising a nozzle tip adapter 12 and a nozzle tip 14.

The nozzle assembly 10 can be mounted into a substrate processing device for dispensing liquid onto a substrate like a wafer. The substrate processing device may be a device for nano- and/or microfabrication.

The nozzle tip 14 is a standard nozzle tip and is a spray nozzle, like a fan spray nozzle, in the shown first embodiment.

Figure 2:
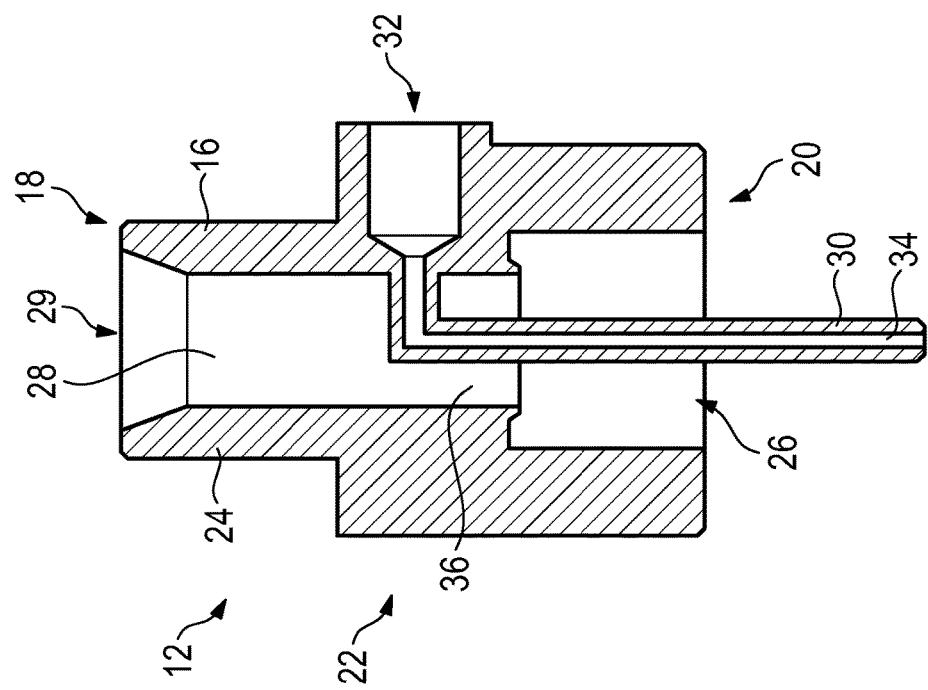
FIG. 2 shows a cross section of the nozzle tip adapter of FIG. 1.

The nozzle tip adapter 12 is also shown in FIG. 2 and comprises a base body 16, for example made out of a plastic material. The base body 16 may be produced by injection molding or 3D-printing.

The base body 16 has a device end 18 and an opposing substrate end 20 as well as a peripheral surface 22 extending between the device end 18 and the substrate end 20. The liquid flows from the device end 18 to the substrate end 20. In the following, the direction "downstream" is used for describing the direction from the device end 18 to the substrate end 20 and further through the nozzle tip 14. Thus, "upstream" describes the opposite direction. The downstream direction coincides with the axial direction of the nozzle tip adapter 12 and the nozzle tip 14.

At the device end 18, the base body 16 is provided with a device protrusion 24 that is threaded at its radially outer surface.

At the substrate end 20, a nozzle tip recess 26 is formed in the base body 16 that has threaded walls.

The size of the device protrusion 24 and the size of the nozzle tip recess 26 are the same, meaning that the device protrusion 24 could be screwed into the nozzle tip recess 26. The size may be chosen to fit standard substrate processing devices or standard nozzle tips 14. Thus, the nozzle tip adapter 12 can easily be inserted in known devices between the substrate processing device and a nozzle tip.

A bore 28 extends from the device end 18 through the device protrusion 24 into the nozzle tip recess 26 in the longitudinal or axial direction of the base body 16.

The upstream end of the bore 28, i.e. its end at the device end 18 forms a supply port 29. The supply port 29 may be threaded or the socket of a coupling. However, it is also possible that the supply port 29 is a hollow protrusion with an outer threading or forming the plug connector of a coupling. In any case, the supply port 29 is adapted to be connected with the substrate processing device.

The adjacent portion of the bore 28 extending through the device protrusion 24 forms a supply duct 36.

Further, the base body 16 comprises a projecting portion 30 that extends partly in the bore 28 and proceeds in the axial direction of the base body 16 into the nozzle tip recess 26. The projecting portion 30 runs along the middle axis of the bore 28, as can be seen in FIG. 3, and is supported at the side wall of the bore 28.

The main body 16 and the projecting portion 30 are formed as a single piece and are therefore immovably fixed to one another.

The projecting portion 30 has a needle shape or is a hollow needle that projects through the nozzle tip recess 26.

The projecting portion 30 further extends in the axial direction fully through the nozzle tip recess 26 and protrudes from the nozzle tip recess 26 with a downstream end. Thus, the downstream end of the projecting portion 30 is the most downstream portion of the nozzle tip adapter 12.

At the peripheral surface 22 of the base body 16, especially downstream of the device protrusion 24, a suction port 32 is provided.

In the shown embodiment, the suction port 32 is formed as a recess extending radially inwards. The recess may be threaded or the socket of a coupling. However, it is also possible that the suction port 32 is a hollow protrusion with an outer threading or forming the plug connector of a coupling. In any case, the suction port 32 is adapted to be connected with a tubing or the like to a vacuum pump or any other low-pressure source.

A suction duct 34 originates from the suction port 32. The suction duct 34 extends in the downstream direction completely through the projecting portion 30 and opens at the downstream end of the projecting portion 30.

The diameter of the suction duct 34 and the projecting portion 30 may be between 0.7 mm and 4.0 mm.

The supply duct 36 is formed as part of the bore 28 in the region of the projecting portion 30.

The supply duct 36 opens into the nozzle tip recess 26 at the upstream end of the nozzle tip recess 26 and surrounds the projecting portion 30 and therefore the suction duct 34.

Thus, the suction duct 34 and the supply duct 36 are coaxial to one another.

In the first embodiment shown in FIGS. 1 to 4, the supply port 29 is located at the device end 18 of the base body 16, for example at the end face of the device end 18, and the suction port 32 is located at the peripheral surface 22 of the base body 16.

Turning now to the nozzle tip 14 as shown in FIG. 1, the nozzle tip 14 comprises a nozzle body 44 with a connection end 46 facing the nozzle tip adapter 12 and a discharge end 48 being the downstream end of the nozzle tip 14 and the nozzle assembly 10.

The nozzle body 44 can also be made of a plastic material and can, for example, be manufactured using injection molding or 3D-printing.

The nozzle body 44 comprises a fastening protrusion 50 that is provided at the connection end 46 and may be engaged into the nozzle tip recess 26 of the nozzle tip adapter 12. For this purpose, the fastening protrusion 50 may be provided with a thread.

From the connection end 46, a liquid chamber extends downstream into the fastening protrusion 50. Another duct, hereinafter called outlet 54, extends from the downstream end of the liquid chamber 52 to the discharge end 48 and opens at the discharge end 48 forming an orifice 56.

The liquid chamber 52 and the orifice 56 are coaxial with one another as well as coaxial with the suction duct 34 and the supply duct 36 of the nozzle tip adapter 12. The diameter d of the outlet 54 is smaller than the diameter D of the liquid chamber 52 but may be larger than the diameter of the suction duct 34 and/or of the projecting portion 30.

The nozzle tip 14 is engaged into the nozzle tip adapter 12 via the fastening protrusion 50 and the nozzle tip recess 26.

In the engaged position shown in FIG. 1, the projecting portion 30 of the nozzle tip adapter 12 extends into the liquid chamber 52 of the nozzle tip 14.

Due to its length, the projecting portion 30 extends through the majority of the liquid chamber 52 in the downstream direction and ends at a distance a from the orifice 56 and the discharge end 48 of the nozzle tip 14.

The distance a is thus the distance between the downstream end of the projecting portion 30 and the orifice 56, i.e. the downstream end of the nozzle tip, and is at least 0.5 times the diameter of the outlet 54. The distance a is maximum 5 times the diameter of the outlet and lies preferably between 1 and 3 times the diameter of the outlet 54.

Due to the projecting portion 30 a channel 58 is formed between the outer walls of the projecting portion 30 and the inner walls of the liquid chamber 52.

The channel 58 is therefore an annular channel around the projecting portion 30 and has a width w from the outer wall of the projecting portion 30 to the inner wall of the liquid chamber 52. The width is, for example, between 0.25 mm and 1.00 mm.

The supply duct 36 of the nozzle tip adapter 12 opens into the liquid chamber 52 at the upstream end of the liquid chamber 52, more precisely the supply duct 36 opens into the channel 58. Therefore, the channel 58 may be seen as an elongation of the supply duct 36.

Thus, both the suction duct 34 and the supply duct 36 open into the liquid chamber 52. Due to the length of the projecting portion 30, the suction duct 34 and the supply duct 36 merge at the downstream end of the liquid chamber 52 and the downstream end of the projecting portion 30.

In operation, the nozzle tip adapter 12 is mounted into a substrate processing device (not shown) via the device protrusion 24 of the nozzle tip adapter 12. In doing so, the supply port 29 of the nozzle tip adapter 12 is connected to a channel of the substrate processing device carrying the liquid to be dispensed onto the substrate.

The substrate may be an uncoated substrate like a wafer or an already coated substrate. The liquid may be a developer, a solvent, water or any other aqueous solution. For example, the substrate is a wafer coated with a photosensitive resin that has already been exposed, and the liquid is a developer for the exposed resin.

The suction port 32 is connected by a suitable tubing to a low pressure source (not shown) like a vacuum pump so that a vacuum can be applied to the suction duct 34.

The liquid is then applied for the length of a defined dispense period. The liquid is supplied from the substrate processing device to the supply port 29, flows through the supply duct 36 into the channel 58 of the liquid chamber 52 and through the outlet 54 where it is dispensed through the orifice 56 towards the substrate (not shown). During the dispense period the low-pressure source is deactivated.

As soon as the supply of liquid has stopped, i.e. at the end of a dispense period, or soon thereafter, the low-pressure source is activated. Thus, low-pressure or a vacuum is applied at the suction port 32.

By applying a vacuum, the liquid remaining in the outlet 54 and in the liquid chamber 52 is sucked into the suction duct 34 and diverted away discharged from the nozzle tip 14 through the nozzle tip adapter 12. Thus, no liquid remains in the outlet 54 that may potentially drip onto the substrate in an uncontrolled fashion.

The low-pressure source may be active permanently during periods in which no liquid is dispensed onto the substrate in order to divert any liquid that may flow unwantedly towards the outlet 54 through the nozzle tip adapter 12.

Thus, due to the short distance between the downstream end of the projecting portion 30, i.e. the point at which the suction duct 34 and the supply duct 36 merge, dripping can be prevented with certainty.

FIGS. 4 to 8 show different embodiments of the disclosure being essentially the same as the nozzle tip adapter 12 shown in FIG. 1. Thus, identical parts or parts with the same function are referenced to using the same numerals and only the differences are described in the following.

FIG. 4 shows a nozzle 60 that is essentially a one-piece version of the nozzle tip adapter 12.

The nozzle 60 has a main body 62 that can be understood as the base body 16 of the nozzle tip adapter 12 and the nozzle body 44 of the nozzle tip 14 made out of one piece.

Thus, the main body 62 comprises all the features of the base body 16 and the nozzle body 44 explained above, obviously without the nozzle tip recess 26, the fastening protrusion 50, the substrate end 20 and the connection end 46. Naturally, the main body 62 only comprises the device end 18 and the discharge end 48.

The main body 62 and the projecting portion 30 are therefore immovably fixed to one another. In particular, the main body 62 and the projecting portion 30 are formed as a single piece.

Further, the liquid chamber 52 is an elongation of the bore 28.

The main body 62 can also be made of a plastic material and can, for example, be manufactured using injection molding or 3D-printing.

Figure 6:
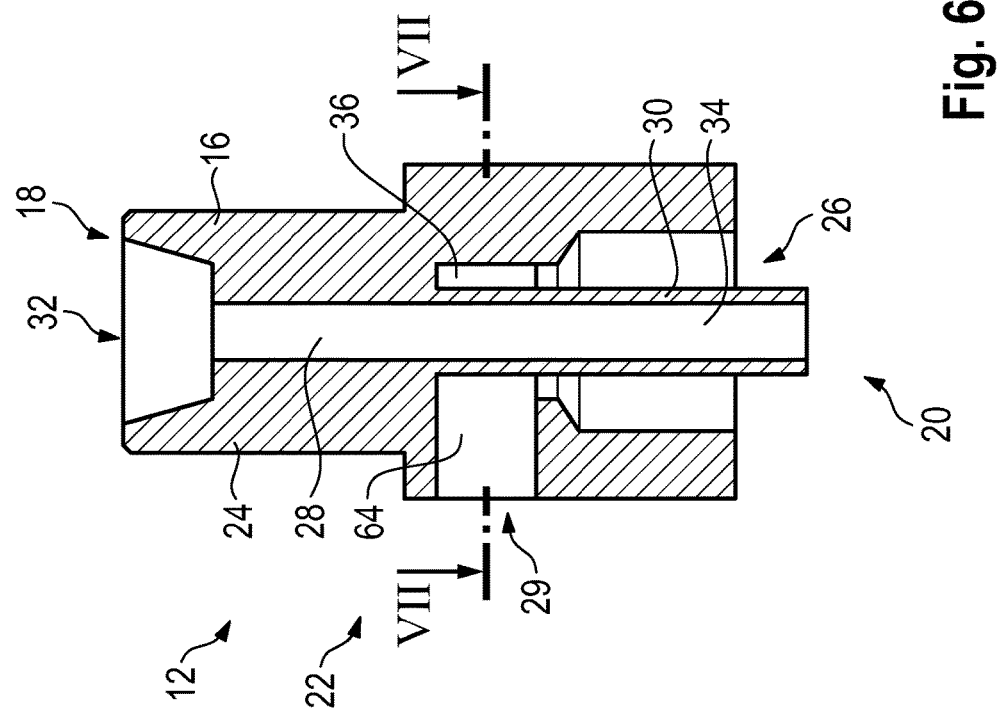
FIG. 6 shows a cross section of the nozzle tip adapter of FIG. 5.
Figure 5:
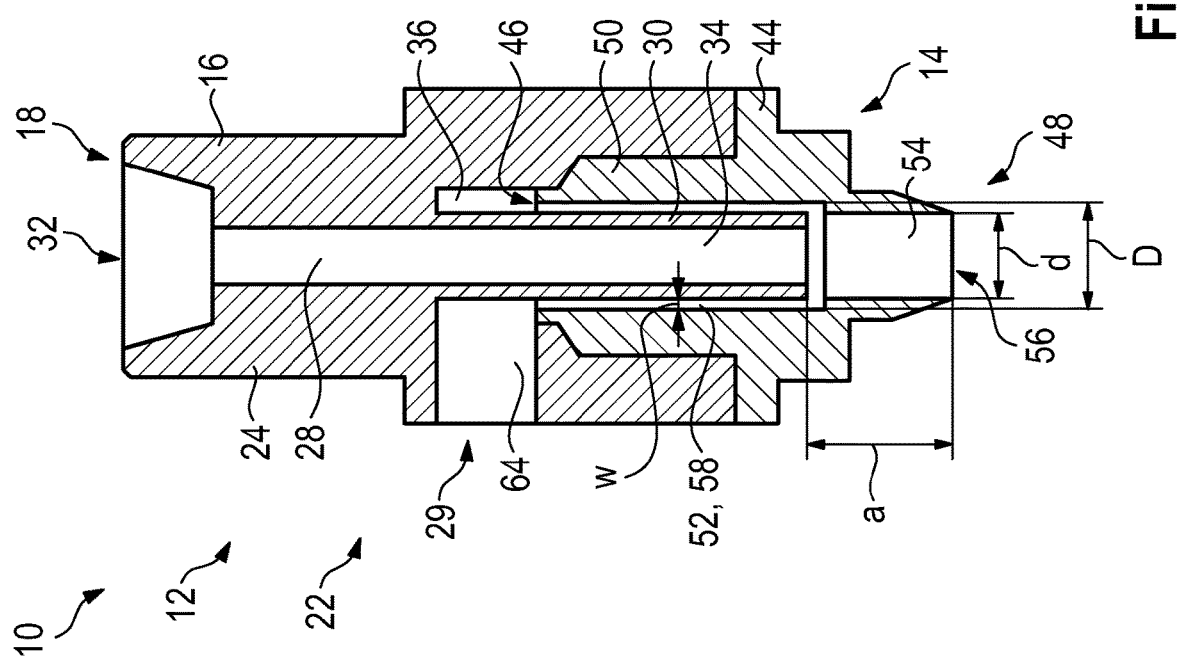
FIG. 5 shows a cross section of a nozzle tip assembly according to a second embodiment of the disclosure with a nozzle tip adapter according to a second embodiment of the disclosure.
Figure 7:
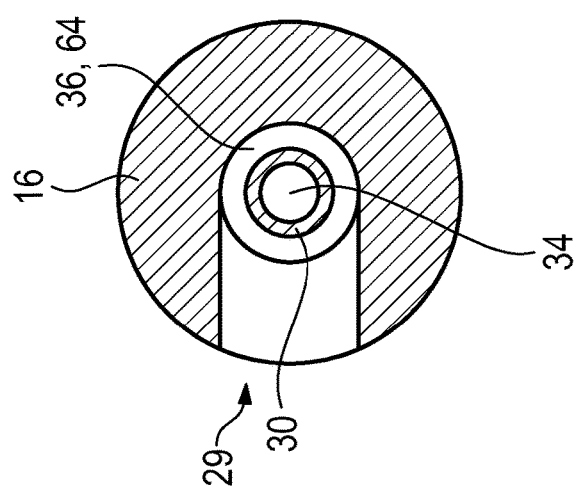
FIG. 7 shows another cross section of the nozzle tip adapter of FIG. 5 across the line VII-VII.

FIGS. 5 to 7 show another embodiment of the nozzle assembly 10 and the nozzle tip adapter 12.

In difference to the first embodiment shown in FIGS. 1 to 3, the locations of the suction port 32 and the supply port 29 have been interchanged.

In this embodiment, the projecting portion 30 does not originate from the inner wall of the bore 28 but extends from the rim of the downstream opening of the bore 28. Accordingly, the suction duct 34 elongates the bore 28, and the suction port 32 is therefore located at the device end 18.

The supply port 29 is now located at the peripheral surface 22 of the base body 16. The supply duct 36 is realized as a recess 64 extending from the supply port 29 radially inwards and around the projecting portion 30.

An annular channel around the suction duct 34 is formed by the recess 64 of the supply duct 36 already within in the nozzle tip adapter 12.

The recess 64 of the supply duct 36 opens in the downstream direction into the nozzle tip recess 26.

In this embodiment the nozzle tip 14 is a puddle nozzle. However, just like in the first embodiment, a spray nozzle, like a fan spray nozzle, could also be used in this embodiment and vice versa. Further, any other standard nozzle tip 14 is also feasible for the nozzle tip adapter 12 and the nozzle assembly 10.

Figure 8:
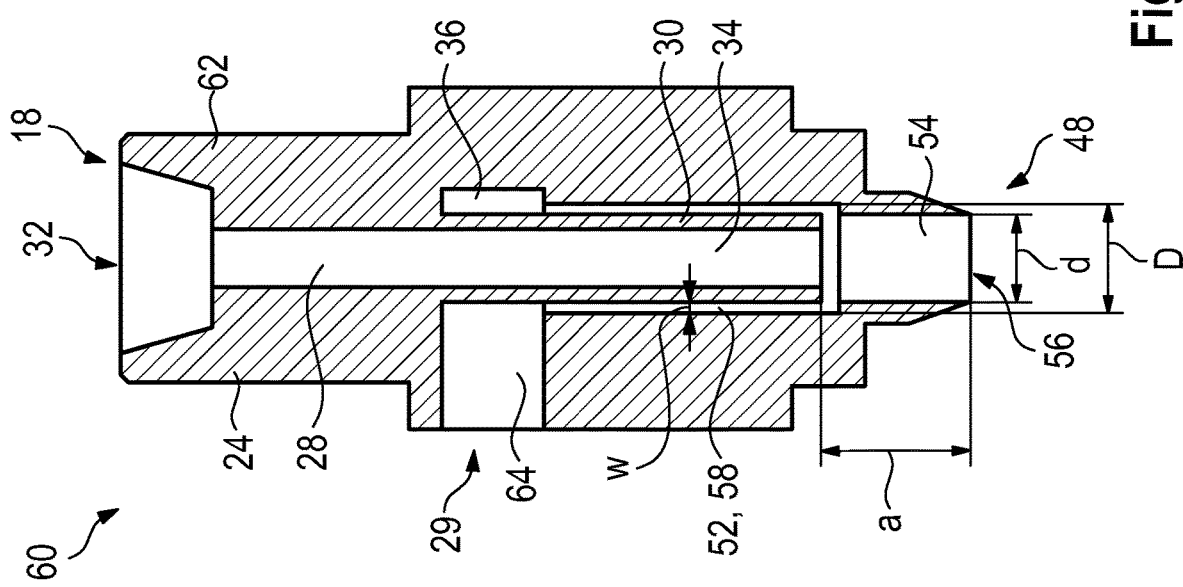
FIG. 8 shows a nozzle according to another embodiment of the disclosure in a cross section.

FIG. 8 shows another embodiment of the disclosure being a one-piece version of the nozzle assembly 10 shown in FIGS. 5 to 7.

Like the nozzle of FIG. 4 with respect to the nozzle assembly of FIGS. 1 to 3, the nozzle 60 of FIG. 8 has a one-piece main body 62 comprising almost all the features of the base body 16 and the nozzle body 44 with the exceptions that have been explained regarding the embodiment of FIG. 4.

However, in the nozzle 60 of the embodiment of FIG. 8, the design of the suction duct 34 and the supply duct 36 follows the design of the embodiments of FIGS. 5, 6 and 7.

Further, in both embodiments, it is possible that both, the suction port 32 and the supply port 29, are located at the device end 18 of the base body 16. For example, the ports 29, 32 could both be realized at the end face of the device end 18. One of the ports 29, 32, for example the suction port 32, may also be located at the inner sidewall of the bore 28.

The invention claimed is:

1. Nozzle tip adapter for mounting a nozzle tip to a substrate processing device, comprising a suction duct, a supply duct, and a base body with a device end and a substrate end, wherein the suction duct and the supply duct are provided in the base body, the base body having a nozzle tip recess at its substrate end for receiving the nozzle tip and a projecting portion extending into the nozzle tip recess, wherein the base body and the projecting portion are immovably fixed to one another, wherein the suction duct extends through the projecting portion and the supply duct opens into the nozzle tip recess, wherein the suction duct is being at least partially surrounded by the supply duct.

2. Nozzle tip adapter according to claim 1, wherein the suction duct extends through the axial length of the projecting portion and opens at the downstream end of the projecting portion.

3. Nozzle tip adapter according to claim 1, wherein the projecting portion extends in an axial direction of the base body through the nozzle tip recess and protrudes from the nozzle tip recess with its downstream end.

4. Nozzle tip adapter according to claim 1, wherein the base body comprises a device protrusion at the device end for fixing the nozzle tip adapter to the substrate processing device.

5. Nozzle tip adapter according to claim 4, wherein the nozzle tip recess and the device protrusion have at least one of the same size and complementary shape.

6. Nozzle tip adapter according to claim 1, wherein the nozzle tip adapter has a suction port and a supply port, wherein the suction port is located at one of either a peripheral surface of the base body or the device end of the base body, and the suction duct originates from the suction port, and wherein the supply port is located at the other of either the peripheral surface of the base body or the device end of the base body, and the supply duct originates from the supply port.

7. Nozzle assembly for a substrate processing device comprising a nozzle tip adapter and a nozzle tip,
the nozzle tip adapter comprising:
 a suction duct, a supply duct, and a base body with a device end and a substrate end, wherein the suction duct and the supply duct are provided in the base body, the base body having a nozzle tip recess at its substrate end for receiving the nozzle tip and a projecting portion extending into the nozzle tip recess, wherein the base body and the projecting portion are immovably fixed to one another, wherein the suction duct extends through the projecting portion and the supply duct opens into the nozzle tip recess, wherein the suction duct is being at least partially surrounded by the supply duct;
the nozzle tip comprising:
 a nozzle body with a connection end and a discharge end,
 a fastening protrusion provided at the connection end,
 a liquid chamber being open towards the connection end and extending at least into the fastening protrusion, and
 an outlet having an orifice at the discharge end and being fluidly connected to the liquid chamber,
 wherein the fastening protrusion of the nozzle tip is received in the nozzle tip recess of the nozzle tip adapter, the projecting portion of the nozzle tip adapter extending into the liquid chamber of the nozzle tip.

8. Nozzle assembly according to claim 7, wherein the supply duct of the nozzle tip adapter opens into the liquid chamber at the upstream end of the liquid chamber.

9. Nozzle assembly according to claim 7, wherein the suction duct of the nozzle tip adapter opens into the liquid chamber at the downstream end of the projecting portion.

10. Nozzle assembly according to claim 7, wherein the outlet has a diameter (d), the distance (a) between the downstream end of the projecting portion and the orifice being at least 0.5 times the diameter (d) of the outlet.

11. Nozzle assembly according to claim 7, wherein the outlet and the suction duct in the projecting portion are coaxial.

12. Nozzle assembly according to claim 7, wherein a channel is being formed between the periphery of the projecting portion of the nozzle tip adapter and inner walls of the liquid chamber, and wherein the supply duct of the nozzle tip adapter opens into the channel.

13. Nozzle assembly according to claim 7, wherein a channel is being formed between the periphery of the projecting portion of the nozzle tip adapter and inner walls of the liquid chamber, and wherein the channel and the suction duct merge at the downstream end of the liquid chamber.

* * * * *